United States Patent [19]

Mukaida et al.

[11] 3,969,541
[45] July 13, 1976

[54] DIFFUSION TRANSFER IMAGE RECEPTIVE MATERIALS

[75] Inventors: Yoshito Mukaida; Eiichi Mizuki; Tomoaki Ikeda; Masayoshi Tsuboi; Akio Ishizuka; Fumiaki Shinozaki, all of Asaka, Japan

[73] Assignee: Fuji Photo Film Co., Ltd., Japan

[22] Filed: Mar. 27, 1972

[21] Appl. No.: 238,228

[30] Foreign Application Priority Data

Mar. 26, 1971 Japan............................ 46-18122

[52] U.S. Cl. .............................. 427/400; 96/29 R; 96/29 L; 96/76 R
[51] Int. Cl.² .................................... G03C 5/54
[58] Field of Search ............ 96/29 R, 29 L, 76 R; 117/47 A, 60, 93, 93.3, 113, 118, 138.8 F, 144, 144.5, 160 R, 34; 427/400

[56] References Cited
UNITED STATES PATENTS

| | | |
|---|---|---|
| 2,404,422 | 7/1946 | Andersen .................... 117/118 X |
| 2,704,262 | 3/1955 | Alink et al. .................. 117/118 X |
| 2,758,943 | 8/1956 | Alink et al. .................. 117/118 X |
| 3,078,178 | 2/1963 | Ostberg ........................ 117/63 X |
| 3,179,517 | 4/1965 | Tregillus et al. .................. 96/29 |
| 3,260,600 | 7/1966 | Haes ............................. 96/76 |
| 3,345,168 | 10/1967 | Wagner et al. .................. 96/76 X |
| 3,532,497 | 10/1970 | Goffe ............................ 96/76 X |
| 3,647,440 | 3/1972 | Rasch ............................ 96/76 X |
| 3,671,241 | 6/1972 | Land .............................. 96/29 |
| 3,690,885 | 9/1972 | Krafft et al. .................... 96/29 R |
| 3,711,283 | 1/1973 | Young ........................... 96/29 R |

Primary Examiner—Michael R. Lusignan
Attorney, Agent, or Firm—Sughrue, Rothwell, Mion, Zinn & Macpeak

[57] ABSTRACT

A diffusion transfer image-receptive sheet comprising (a) a sheet of an alkali impermeable polymer having a surface portion converted into an alkali permeable state and (b) diffusion transfer nuclei incorporated in the alkali permeable surface portion.

15 Claims, 6 Drawing Figures

FIG. 1
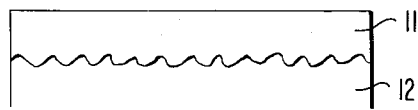
FIG. 2
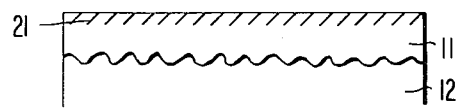
FIG. 3
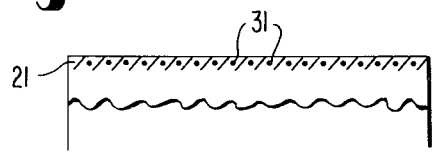
FIG. 4
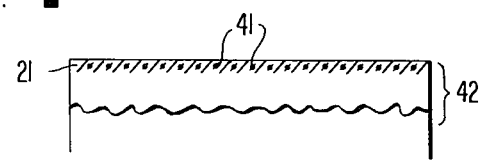
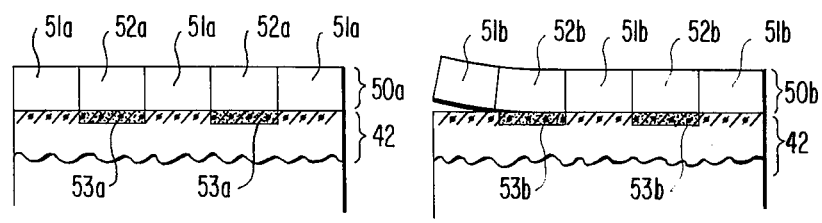
FIG. 5a          FIG. 5b

DIFFUSION TRANSFER IMAGE RECEPTIVE MATERIALS

BACKGROUND OF THE INVENTION

1. Field of the Invention

The instant invention relates generally to a diffusion transfer image-receptive material. More particularly, it relates to a diffusion transfer image-receptive material in which the surface portion of an alkali impermeable polymer sheet has been provided with alkali permeability.

2. Description of the Prior Art

In general, a diffusion transfer image-receptive material comprises a support and a layer of a hydrophilic high molecular weight material or polymer coated on the support, with the hydrophilic layer containing diffusion transfer nuclei dispersed therein. The above conventional diffusion transfer image-receptive material is usually prepared by dispersing the diffusion transfer nuclei in the hydrophilic high molecular weight material and coating a support with the dispersion. The hydrophilic high molecular weight compounds generally used in the diffusion transfer image-receptive material are, for example, gelatin, polyacrylic acid, a maleic anhydride-methyl methacrylate copolymer, vinyl derivatives such as polyvinyl alcohol and polyvinyl pyrrolidone, cellulose derivatives such as carboxymethyl cellulose and hydroxyethyl cellulose, metal salts thereof, alginates, and the like.

However, when such conventional transfer image-receptive materials are brought into contact with a silver halide emulsion layer to conduct a diffusion transfer process and thereafter the unnecessary silver halide emulsion layer is removed from the image-receptive material, such materials are accompanied with disadvantages caused by (1) difficulty with the stripability of the silver halide emulsion layer to the extent that a specific strippable layer must be utilized; (2) requiring a considerable period of time to wash with water and dry the image-receptive layer after finishing the diffusion transfer process, or the surface of the image-receptive layer remaining sticky, even after drying. Moreover, there is also the disadvantage that the silver image obtained by the diffusion transfer process is mechanically or chemically weak.

To overcome such disadvantages, an improved image-receptive material containing diffusion transfer nuclei for precipitating silver in a diffusion transfer process throughout the sheet of an alkali impermeable material is known. Such a material is prepared by incorporating the diffusion transfer nuclei in the alkali impermeable material by utilizing vacuum evaporation, and after forming a sheet of the material from a solution of the nuclei-containing material, the sheet is treated chemically to provide an alkali permeability thereto as disclosed in, e.g., Japanese patent publication No. 32754/1969. However, the above image-receptive material has the following disadvantage. That is to say, although a vacuum evaporation apparatus now is quite well-known, it is technically quite difficult to conduct the vacuum evaporation of a material which forms the diffusion transfer nuclei repeatedly under constant conditions, which is necessary in case of manufacturing such specific products on an industrial scale. Also, in the improved technique the diffusion nuclei material is vacuum evaporated on the surface of the alkali impermeable material, the material is then dissolved in a solvent, and after forming a sheet from the solution, the sheet is treated by hydrolysis or the like to provide alkali permeability to a surface portion thereof. Thus, only the surface portion provided with the alkali permeability is effectively utilized in the diffusion transfer process and the diffusion transfer nuclei in the alkali immpermeable portion of the sheet are useless. Furthermore, as a fatal disadvantage, because the sheet of the alkali impermeable material containing the diffusion transfer nuclei is subjected to a treatment such as hydrolysis, the activity of the diffusion transfer nuclei contained therein as silver precipitants on diffusion transfer is reduced.

An object of the instant invention is, therefore, to provide a diffusion transfer image-receptive material not having the disadvantages as mentioned above.

Another object of this invention is to provide a diffusion transfer image-receptive material which can be prepared in a simple manner and has excellent chemical and physical properties.

SUMMARY OF THE INVENTION

The above-described objects of this invention can be attained by providing an alkali permeability to the surface portion of a sheet of an alkali impermeable polymer and simultaneously incorporating diffusion transfer nuclei in the surface portion thereof.

The objects of this invention have effectively been attained by incorporating the diffusion transfer nuclei in the alkali permeable surface portion at the same time with the rendering of the surface portion of the polymer sheet alkali permeable.

BRIEF DESCRIPTION OF THE ACCOMPANYING DRAWINGS

The invention will now be further explained in detail with reference to the accompanying drawings.

FIG. 1 to FIG. 4 are schematic cross sectional views explaining stepwise an embodiment of preparing the diffusion transfer image-receptive material of this invention and FIGS. 5a and b are views showing an embodiment of forming an image by using the diffusion transfer image-receptive material of this invention.

DETAILED DESCRIPTION OF THE INVENTION

The term "alkali impermeable material" as used in this specification is intended to cover a material through which a diffusion transfer developing solution, mainly containing water as the solvent, is less permeable, and the term "alkali permeable portion or layer" as used in this specification is intended to cover such a portion or layer that a diffusion transfer developing solution, mainly containing water as the solvent, can permeate therethrough under ordinary developing conditions, e.g., in less than 15 minutes at 20°C. Also, the surface portion of a sheet of an alkali impermeable polymer means at least one surface portion of the polymer sheet and, as a matter of course, the thickness of the surface portion must be less than the thickness of the sheet. From a practical standpoint, the thickness of such an alkali permeable surface portion ranges from about 0.1 to about 30 microns, preferably from about 0.3 microns to about 10 microns, and most preferably from about 0.3 microns to about 5 microns. The thickness of the support upon which the surface is either rendered alkali permeable (i.e., where the alkali impermeable portion also serves as a support) or upon which a polymer layer is applied with the polymer layer being capable of being rendered alkali permeable (i.e., where an alkali impermeable polymer whose surface can be rendered alkali permeable is applied to a support) can vary broadly depending upon the nature of the end use desired for the diffusion transfer image-receptive materials and the processing to which such materials are subjected. For example, the support thickness can range from above about 10 microns, to above about 30 microns and preferably above about 80 microns. An especially practical range of support thickness is from about 150 microns to about 200 microns. All that is required is that the support thickness be of sufficient mechanical stability and strength to permit its use in the application desired. The thickness of the surface portion is measured by observing the depth of the silver image formed using an electron microscopic photograph of a cross section of the sheet or observing the cross section of the sheet after dyeing the alkali permeable portion of the sheet with a dye which will dye only the alkali permeable portion.

The image receptive material of this invention may be prepared by various methods, several examples of which are illustrated below:

1. The surface portion of a sheet of an alkali impermeable polymer is rendered alkali permeable by using a treating solution and then diffusion transfer nuclei material is incorporated in the alkali permeable surface portion of the sheet by an immersion process or by a coating process.

2. The surface portion of a sheet of an alkali impermeable polymer is treated with a treating solution containing the diffusion transfer nuclei, this treating solution being capable of converting the sheet of the alkali impermeable polymer into an alkali permeable material, whereby the surface portion is rendered alkali permeable while at the same time the diffusion nuclei are introduced into the surface portion.

3. The surface portion of a sheet of an alkali impermeable polymer is treated with treating solution containing the diffusion transfer nuclei to incorporate the diffusion transfer nuclei in the surface portion and thereafter the surface portion is provided with an alkali permeability by treating it in a second treating solution.

4. The surface portion of a sheet of an alkali impermeable polymer is treated to render it an alkali permeable, the sheet is immersed in a solution containing a salt of a heavy metal to incorporate the heavy metal salt into the alkali permeable surface portion and in the wet state or and after drying the sheet of the alkali impermeable polymer having an alkali permeable surface portion containing the heavy metal salt is exposed to a sulfur vapor, to a selenium atmosphere or to a reducing gas atmosphere, whereby a sulfide of the heavy metal, a selenide of the heavy metal, or the elemental heavy metal is formed in the alkali permeable surface portion of the sheet.

5. The surface portion of a sheet of an alkali impermeable material is treated to render it alkali permeable, a metal salt which can provide diffusion transfer nuclei is introduced into the surface portion of the sheet after this treatment or simultaneously with this treatment, and then the metal salt is reduced by irradiation with light to form the diffusion transfer nuclei in the alkali permeable surface portion of the sheet.

The method which forms the basis of the present application is method (2) above.

The alkali impermeable polymers which can be employed in this invention, are cellulose organic acid esters such as cellulose diacetate, cellulose triacetate, or mixtures of these materials, cellulose acetate, cellulose propionate, cellulose butyrate, cellulose acetate butyrate, etc.; cellulose inorganic acid esters such as cellulose nitrate, etc.; polyesters such as polyethylene terephthalate, polystyrenes, polyvinyl acetates; polyvinyl acetals such as polyvinyl acetal; and the like.

The surface portion of a sheet of an alkali impermeable polymer as described above can be rendered alkali permeable using known methods. For instance, when a cellulose ester is employed as the sheet material, the surface portion of the sheet can be rendered alkali permeable by hydrolyzing the surface portion in an alkali solution. When polyvinyl acetal is employed as the sheet material, the surface portion can be rendered alkali permeable by hydrolyzing the surface portion in an acid solution. Also, when polyethylene terephthalate or polystyrene is employed, the surface portion can be modified by the action of bichromic acid or nitric acid or the surface portion of the sheet may be oxidized by the action of ozone or by subjection to high frequency radiation or a corona discharge.

It will be readily understood by one skilled in the art that the above-described methods of providing alkali permeability to the surface portion of a sheet of an alkali impermeable polymer can be easily practiced and also the appropriate reaction conditions can be easily determined in each case.

The examples of the diffusion transfer nuclei include heavy metals such as cadmium, tin, zinc, chromium, nickel, and cobalt; noble metals such as gold, silver, platinum, and palladium; and the sulfides or selenides of these heavy metals or these noble metals.

The instant invention provides an alkali permeability to the surface portion of the sheet of the alkali impermeable polymer by treating this sheet and at the same time incorporating in the surface portion a material capable of providing diffusion transfer nuclei. Accordingly, there is no distinct interface within the sheet of the alkali impermeable polymer and the alkali permeable surface portion thereof and the nature of the sheet gradually or continuously changes from an alkali impermeable sheet into an alkali permeable state in the surface portion. Thus, the diffusion transfer image-receptive material of this invention does not result in the stripping off of the alkali permeable layer as is the case of conventionally forming the alkali permeable layer by coating. Also, because the diffusion transfer nuclei are present substantially in the alkali permeable material of the surface portion of the sheet of an alkali impermeable polymer, the silver image formed near the nuclei by a diffusion transfer is not easily removed by rubbing or swabbing. Such an advantage provides improved printability or printing resistance when such a sheet is used as a printing material. Moreover, when the surface portion of a sheet of the alkali impermeable polymer is treated in a treating solution containing the diffusion transfer nuclei using the specific methods (1) and (2) described above, the chemical treatment for providing the alkali permeable characteristic after introducing the diffusion transfer nuclei as in Japanese patent publication No. 32754/1969 mentioned before is unnecessary and accordingly no reduction in activity of the nuclei by post chemical treatment occurs with the instant invention.

This invention further provides a material in which only the surface portion of the sheet of the alkali impermeable polymer has been rendered alkali permeable and in which the diffusion transfer nuclei are present in only the surface portion of the sheet of the alkali impermeable polymer and are not contained throughout the entire sheet. Consequently, the alkali impermeable portion of the sheet acts as a water-proofing layer and simultaneously the diffusion transfer layer of this invention can be used as an offset printing plate by utilizing the hydrophilic property of the alkali permeable material and the ink receptive property of the alkali impermeable material.

Still further, the invention comprises a material for providing nuclei for a diffusion transfer process or at least a part of the component of the diffusion transfer nuclei is incorporated in the alkali permeable portion of the sheet in a solution or a colloid solution state. That is to say, the specific means required for conducting the vacuum evaporation as in the above described Japanese patent publication No. 32754/1969 is not necessary.

As described before, the image-receptive material of this invention is particularly suitable as a material for use in diffusion transfer photographic process. Also, the image-receptive material of this invention may be brought into contact with an exposed silver halide emulsion layer before development and may have coated thereon a silver halide emulsion layer before exposure and development. In the latter case, a suitable stripping layer may be employed or a silver halide emulsion layer which can be readily washed away after development may be employed. For instance, a non-hardened gelatino silver halide emulsion or a silver halide emulsion employing cellulose acetate or polyvinyl hydrogen phthalate as a binder may be used or a synthetic resin layer or a natural high molecular weight material layer containing or not containing a pigment may be formed between the image-receptive material of this invention and a silver halide emulsion layer.

By subjecting the image-receptive material of this invention having coated thereon a silver halide emulsion layer to a diffusion transfer development or by bringing the image-receptive material of this invention into contact with a silver halide emulsion layer formed on another support and conducting a diffusion transfer development, the image-receptive material of this invention thus processed can be used for various purposes, such as black and white prints, color prints, projector sheets for use in an over head projector, masters for offset printing, patterns for printed circuits, and masters for heat transfer.

The image-receptive material of this invention is particularly useful as masters for lithographic printing. That is to say, a positive or negative silver image is formed on the image-receptive material of this invention by the above-described diffusion transfer process and then it is bleached in the solution having the following compositions, whereby the alkali permeable portion adjacent to the silver images and also the alkali impermeable portions of the sheet are simultaneously deteriorated and become fragile (this treatment is generally called an "etching bleach"). Thus, when the alkali impermeable portion is removed along the patterns of the silver image, the surface of the sheet of the alkali impermeable polymer is exposed at the portions removed. The exposed surface of the sheet of the alkali impermeable polymer has a higher oleaginous ink receptive property than that of the non-image portions, i.e., the unremoved alkali permeable surface portion, and thus the product can be used as the master for lithographic printing.

An example of a composition for an etching bleach solution for use as above-described is as follows:

| | |
|---|---|
| Cupric Chloride | 50 g |
| Citric Acid | 50 g |
| Hydrogen Peroxide (aqueous solution 30% by weight) | 500 ml |
| Water added to make the total volume to 10 liters. | |

An embodiment of the image-receptive material of this invention employed as a master for over head projector use will now be shown. That is to say, when a silver image is formed on the image-receptive material, it can be used per se as a master for over head projector use or when the image-receptive material having a silver image is further processed in an etching bleach solution as used in preparing a master for lithographic printing as described above, the portions adjacent the silver image become concave to provide a relief image and such can be employed as a master for over head projector use.

With reference to the drawings briefly described hereinbefore, FIG. 1 shows a cross sectional view of the sheet 11 of an alkali impermeable polymer, which may be supported on a support 12 such as a paper, a plastic film, or a metallic foil. (Sheet 11 may also be unsupported). FIG. 2 shows the condition in which the surface portion of the sheet of the alkali impermeable polymer is converted into an alkali permeable portion 21 by an acid hydrolysis or an alkali hydrolysis. FIG. 3 shows the condition in which a material 31 capable of forming diffusion transfer nuclei is incorporated in the alkali permeable portion 21. FIG. 4 shows the condition in which the material 31 has been converted into the diffusion transfer nuclei 41 and the product shown in this figure is the diffusion transfer image-receptive material 42 of this invention.

FIG. 5 shows an embodiment of the use of the image-receptive material of this invention. FIG. 5a shows the image-receptive material 42 of this invention having coated thereon a silver halide emulsion layer 50. By exposure of the emulsion layer 50a, an exposed portion 51a and an unexposed portion 52a are formed. The portion 53a of the image-receptive material corresponding to the unexposed portion of the emulsion layer shows that a silver image is formed by the diffusion transfer development. By removing the emulsion layer from the image-receptive material, a positive silver image is formed in the surface portion of the image-receptive material. FIG. 5b shows an embodiment in which an exposed silver halide emulsion layer 50b is brought into contact with the image-receptive material 42 while providing a diffusion transfer developing solution between them and exposed portions 51b and unexposed portions 52b are formed in the silver halide emulsion layer. A silver image is formed by diffusion transfer development in the portion 53b of the surface portion of the image-receptive material corresponding to the unexposed portion 52b.

The following examples will serve to illustrate the disclosure in greater detail. Examples 4 and 7 in particular illustrate the present invention. All parts and percentages are by weight unless otherwise indicated.

EXAMPLE 1

A sheet of cellulose triacetate having a thickness of 100 microns was hydrolyzed for 6 minutes at 20°C in a solution having the following composition:

| | |
|---|---|
| Water | 500 g |
| Methanol | 500 g |
| Potassium Hydroxide | 70 g |

The sheet upon which a hydrolyzed surface portion was formed was neutralized in a 5% aqueous solution of acetic acid, washed with water, and dried. The sheet was then immersed in a methanol solution of 0.03 wt. % chloroauric acid for 30 seconds and dried. It is preferable to irradiate the sheet with ultraviolet rays on drying the sheet but when the sheet was allowed to dry for 1 day at normal temperature, a sufficient amount of diffusion transfer nuclei were formed in the hydrolyzed surface portion of the cellulose triacetate sheet. Thus, the diffusion transfer image-receptive material of this invention was prepared.

A silver chlorobromide emulsion (70 mole % silver chloride) containing 1 mol of silver per kilogram of emulsion was applied to the surface of the image-receptive material thus prepared in a dry thickness of 3 microns and after imagewise exposure of the emulsion layer, the image-receptive material having the emulsion layer was processed for 30 seconds at 20°C in a developing solution having the following composition;

| | |
|---|---|
| Water | 750 ml |
| p-Methylaminophenol Sulfate | 5 g |
| Sodium Sulfite (anhydrous) | 65 g |
| Hydroquinone | 15 g |
| Sodium Thiosulfate (anhydrous) | 15 g |
| Sodium Hydroxide | 20 g |
| Water added to make the total volume 1,000 ml. | |

By removing the silver halide emulsion layer with water at 50°C, a positive silver image was obtained.

EXAMPLE 2

In the same manner as described in Example 1, a sheet of cellulose diacetate having a thickness of 125 microns was hydrolyzed, neutralized, washed with water and dried. The resulting sheet was then immersed in a chloroauric acid solution under the same conditions as described in Example 1. After withdrawing the sheet from the chloroauric acid solution, the solution on the surfaces thereof was removed immediately, distilled water was applied to the surface in an amount of 10 ml per one square meter of the sheet, and then water was completely removed from the surface immediately. The sheet was allowed to stand for one day and a silver halide emulsion was applied to the surface thereof. The sheet was then immersed in a methanol solution of 0.03 wt. % chloroauric acid for 30 seconds and dried. It is preferable to irradiate the sheet with ultraviolet rays on drying the sheet but when the sheet was allowed to dry for one day at normal temperature, a sufficient amount of diffusion transfer nuclei were formed in the hydrolyzed surface portion of the cellulose triacetate sheet.

EXAMPLE 3

A sheet of cellulose butyrate having a thickness of 50 microns was piled on a high quality paper of 75 g/m² and the back surface of the paper was coated with polyethylene in a thickness of 40 microns. The resultant sheet was immersed for 2 minutes at 45°C in a solution having the following composition to hydrolyze the surface portion of the cellulose butyrate sheet.

| | |
|---|---|
| Water | 400 g |
| Ethanol | 500 g |
| Ethylene Glycol | 100 g |
| Sodium Hydroxide | 100 g |

Thereafter, a methanol solution of 0.06 wt. % nickel chloride ($6H_2O$) was applied to the surface of the cellulose butyrate layer. After drying, the sheet was immersed for one minute in an aqueous solution of 0.5 wt. % sodium sulfide. By washing with water and drying the sheet, a completely transparent diffusion trasfer image-receptive sheet was obtained.

The image-receptive sheet thus prepared as brought into contact with imagewise exposed silver chloride emulsion layer (wherein the silver: gelatin ratio was 1:2) provided on a support while spreading a developing solution having the same composition as described in Example 1 between them and after allowing them to stand for 30 seconds, the silver halide emulsion layer was removed to provide a black positive silver image.

EXAMPLE 4

Colloidal nickel sulfide (0.5 wt. % aqueous gelatin solution) was prepared in an aqueous 2.0 wt. % gelatin solution and 15 g of the aqueous gelatin solution containing the nickel sulfide was mixed with 600 g of water and 400 g of methanol at 40°C. A sheet of cellulose acetate butyrate (Type 161-40, trade name, made by the Eastman Kodak Co.) having a thickness of 100 microns was immersed in the mixture prepared above for 90 seconds at 40°C to hydrolyze the surface portion of the sheet and simultaneously to introduce the diffusion trasfer nuclei into the surface portion. The sheet was, then, washed with water and dried to provide a diffusion transfer image-receptive sheet.

By treating the image-receptive sheet in the same manner as described in Example 3, a black positive silver image was obtained.

EXAMPLE 5

| Solution A: | |
|---|---|
| Glycerine | 50 ml |
| Methanol | 300 ml |
| Sodium Sulfide $9H_2O$ | 1.2 g |
| Sodium Carbonate.$H_2O$ | 0.2 g |
| Water | 10 ml |
| Solution B: | |
| Cadmium Acetate.$2H_2O$ | 13.3g |
| Water | 10 ml |

Solution B having the above composition was added to Solution A with stirring and cadmium sulfide was dispersed in the mixed solution to provide Solution C. Then, 100 g of the Solution C thus prepared was mixed with Solution D having the following composition to provide Solution E;

| | |
|---|---|
| Water | 800 ml |
| Sodium Hydroxide | 200 ml |
| Methanol | 1200 ml |

A sheet of cellulose triacetate having a thickness of 135 microns was immersed in Solution E prepared above for 40 seconds at 40°C and then the sheet was washed with warm water and dried to give a diffusion transfer image-receptive sheet.

A silver iodobromide emulsion (5 mole % silver iodide) containing 1.2 mols of silver per kilogram of emulsion and orthochromatically sensitized with a sensitizing dye was applied to the surface of the image-receptive sheet at a dry thickness of 5 microns.

The light sensitive sheet thus prepared was exposed to a positive and developed for 20 seconds at 25°C in a developing solution having the same composition as described in Example 1. Then, by dissolving away the silver iodobromide emulsion layer with warm water at 45°C, a positive silver image was obtained. The sheet bearing the silver image could be used with an overhead projector.

EXAMPLE 6

A polystyrene sheet having a thickness of 120 microns was immersed in concentrated sulfuric acid for 10 seconds at 50°C to sulfonate the surface portion of the sheet. The sheet was then washed with water and immersed in 1 N aqueous sodium hydroxide solution to neutralize the acid. The sheet was further washed with water and dried. Thereafter, the sheet was immersed for 60 seconds at 30°C in dispersion of colloidal nickel sulfide prepared in a mixture of 80 g of ethylene glycol monobutyl ether, 15 g of methanol, and 5 g of water, where the nickel sulfide was introduced into the surface portion of the sheet to provide a diffusion transfer image-receptive material. By treating the image-receptive sheet thus prepared as described in Example 3, a black positive silver image was obtained.

EXAMPLE 7

A diffusion transfer receptive sheet was prepared as follows:

A sheet of cellulose triacetate having a thickness of 155 microns was immersed for 60 seconds at 40°C in Solution D prepared below thereby the surface portion of said sheet was provided with an hydrophilic property by hydrolyzing the surface portion and simultaneously nickel sulfide was introduced into the surface portion.

| Solution A: | |
|---|---|
| Glycerine | 100 g |
| Ammonium Sulfide (aqueous solution having sulfur content of 14.3%) | 30 ml. |
| Solution B: | |
| Glycerine | 180 g |
| Nickel Chloride 6H$_2$O | 0.3 g |

Solution C was prepared by mixing Solution A and Solution B with stirring for 5 minutes at 30°C. Also, Solution D was prepared by mixing 250 g of Solution C with a solution composed of 3000 g of methanol, 2000 g of water, and 500 g of sodium hydroxide.

A silver chlorobromide emulsion (70 mole % silver chloride) containing one mol of silver per kilogram of emulsion, which had been gold sensitized and further orthochromatically sensitized with a sensitizing dye was applied to the diffusion transfer image-receptive sheet prepared as described above in a dry thickness of 4 microns. Then, in the same manner as described in Example 1, the sheet was exposed and developed for 30 seconds at 15°C in a developing solution having the same composition as described in Example 1. The silver halide emulsion layer was removed using warm water at 50°C, whereby a positive silver image was obtained.

The sheet having the silver image was treated for 30 seconds at 20°C in a Solution C having the following composition and then rinsed. Thereafter, by removing the cellulose or the cellulose derivative layer at the silver image portion or adjacent the silver image deteriorated by the treatment with a sponge, an offset printing plate was obtained. An offset ink attached to the portions where the silver image had been formed but did not attach at non-image portions.

| Solution A: | |
|---|---|
| Cupric Chloride | 15 g |
| Glacial Acetic Acid | 50 ml |
| Water to make | 1 liter |
| Solution B: | |
| Hydrogen Peroxide (aqueous solution 35% by weight) | 100 ml |
| Solution C was prepared by mixing Solution A and Solution B | |

While the invention has been described in detail by reference to preferred embodiments thereof, it be apparent that various changes and modifications and be made therein without departing from the spirit and scope thereof.

What is claimed is:

1. A process for producing a diffusion transfer image receptive sheet comprising an alkali impermeable polymer, which process comprises contacting a surface portion of said alkali impermeable polymer with a solution containing both diffusion transfer nuclei and at least one material which is capable of converting the alkali impermeable polymer into an alkali permeable state to simultaneously make said surface portion of said alkali impermeable polymer alkali permeable and incorporate therein diffusion transfer nuclei.

2. The process of claim 1, wherein said solution includes a solvent selected from water, an alcohol, a polyol, a mixture of water and an alcohol, or a mixture of water and a polyol.

3. The process of claim 2, wherein said alcohol is methanol or ethanol, and said polyol is glycerin.

4. The process of claim 2, wherein said material which is capable of converting the alkali impermeable polymer into an alkali permeable state is an alkali.

5. The process of claim 4, wherein said alkali is sodium hydroxide or potassium hydroxide.

6. The process of claim 1, wherein said process consists of said solution contacting with said surface portion of said alkali impermeable polymer.

7. The process of claim 1, wherein said alkali impermeable polymer is cellulose organic acid esters, cellulose inorganic acid esters, polyvinyl acetals, polyethylene terephthalate, polystyrene or polyvinyl acetate.

8. The process of claim 7, wherein said cellulose organic acid ester is cellulose diacetate, cellulose triacetate, a mixture of cellulose diacetate and cellulose triacetate, cellulose propionate, cellulose butyrate, or cellulose acetate butyrate.

9. The process of claim 7, wherein said cellulose organic acid ester is cellulose triacetate, cellulose diacetate, or a mixture of cellulose diacetate and cellulose triacetate.

10. The process of claim 7, wherein said cellulose inorganic acid ester is cellulose nitrate.

11. The process of claim 1, wherein said diffusion transfer nuclei is selected from the group consisting of nuclei of a heavy metal, a noble metal, a sulfide of said heavy metal, a selenide of said heavy metal, a sulfide of said noble metal, and a selenide of said noble metal.

12. The process of claim 1, wherein said alkali permeable surface portion ranges from about 0.1 to about 30 microns in thickness.

13. The process of claim 11, wherein said heavy metal is selected from the group consisting of cadmium, tin, zinc, nickel, chromium and cobalt, and wherein said noble metal is selected from the group consisting of gold, silver, platinum and palladium.

14. The process of claim 12, wherein said alkali permeable surface portion ranges from about 0.3 to about 10 microns.

15. The product produced by the process of claim 1.

* * * * *